US010102329B2

(12) United States Patent
Miller et al.

(10) Patent No.: US 10,102,329 B2
(45) Date of Patent: Oct. 16, 2018

(54) METHOD AND APPARATUS FOR VALIDATING A TEST PATTERN

(71) Applicant: FREESCALE SEMICONDUCTOR, INC., Austin, TX (US)

(72) Inventors: Yoav Miller, Rehovot (IL); Asher Berkovitz, Kiryat Ono (IL); Sergey Sofer, Rishon Lezion (IL)

(73) Assignee: NXP USA, INC., Austin, TX (US)

( * ) Notice: Subject to any disclaimer, the term of this patent is extended or adjusted under 35 U.S.C. 154(b) by 163 days.

(21) Appl. No.: 15/101,965

(22) PCT Filed: Dec. 13, 2013

(86) PCT No.: PCT/IB2013/060928
§ 371 (c)(1),
(2) Date: Jun. 6, 2016

(87) PCT Pub. No.: WO2015/087114
PCT Pub. Date: Jun. 18, 2015

(65) Prior Publication Data
US 2016/0314240 A1 Oct. 27, 2016

(51) Int. Cl.
*G06F 17/50* (2006.01)
*G01R 31/3183* (2006.01)

(52) U.S. Cl.
CPC . *G06F 17/5081* (2013.01); *G01R 31/318342* (2013.01); *G01R 31/318364* (2013.01); *G06F 2217/14* (2013.01)

(58) Field of Classification Search
CPC .................................................. G06F 17/5081
USPC .......................................................... 716/136
See application file for complete search history.

(56) References Cited

U.S. PATENT DOCUMENTS

| | | |
|---|---|---|
| 2005/0154552 A1 | 7/2005 | Stroud et al. |
| 2006/0041810 A1 | 2/2006 | Ishida et al. |
| 2008/0222473 A1 | 9/2008 | Taku |
| 2010/0095179 A1 | 4/2010 | Wen et al. |
| 2010/0275077 A1 | 10/2010 | Rajski et al. |
| 2014/0365148 A1* | 12/2014 | Tehranipoor ... G01R 31/318364 702/60 |

OTHER PUBLICATIONS

Lee, J., et al., "Layout-Aware, IR-Drop Tolerant Transition Fault Pattern Generation", ECE Department, University of Connecticut, 2008 EDAA.
Wu, M.-F., et al., "A Scalable Quantitative Measure of IR Drop Effects for Scan Pattern Generation", Dept. of Electrical Engineering, National Taiwan University, Taipei, 2010 IEEE.
International Search Report and Written Opinion dated Sep. 17, 2014 in PCT Application No. PCT/IB2013/060928.

* cited by examiner

*Primary Examiner* — Suchin Parihar

(57) ABSTRACT

A method and apparatus of validating a test pattern for at-speed testing of at least one integrated circuit, IC, design. The method comprises calculating at least one weighted rise activity, WRA, value for at least one region of the IC design based at least partly on rising gate transitions within the at least one region of the IC design when the test pattern is applied thereto, calculating at least one weighted fall activity, WFA, value for the at least one region of the IC design based at least partly on fall gate transitions within the at least one region of the IC design when the test pattern is applied thereto, and validating the test pattern based at least partly on the WRA value and the WFA value.

19 Claims, 3 Drawing Sheets

METHOD AND APPARATUS FOR VALIDATING A TEST PATTERN

FIELD OF THE INVENTION

This invention relates to a method and apparatus for validating a test pattern, and in particular to a method and apparatus of validating a test pattern for at-speed testing of at least one integrated circuit, IC, design.

BACKGROUND OF THE INVENTION

At-speed testing is an important method for testing internal integrated synchronous circuit functionality, and is essential in enabling reliable and cost-effective testing of semiconductor devices to be performed. However, at-speed testing power consumption is higher than functional mode power consumption. During the capture period, a circuit can draw a large supply current and cause a large voltage drop ("IR-drop") over the power and ground distribution network (PDN). Excessive IR-drops in the PDN can reduce switching speeds and noise margins of circuits, and inject noise which might lead to functional failures. Significantly, the higher-than-functional switching activity created during at-speed testing can result in such excessive IR-drops, which can cause functionally correct devices to fail the at-speed testing, which can lead to an unnecessarily low product yield.

The effort of power consumption reduction during at-speed testing to avoid excessive IR-drops occurs at the design stage, using ATPG (Automatic Test Pattern Generation) tools. Conventional ATPG tools use toggling based metrics such as Weighted Switching Activity (WSA) values for identifying test patterns that could cause large IR-drops, so that those test patterns can be filtered out. The WSA of a circuit caused by a particular test pattern is typically calculated by identifying all gates in the circuit that are caused to switch state by the test pattern, determining a weighted value for each switching gate based on, for example, the fan-out count for the respective gate, and summing the weighted gate values of the switching gates to obtain the weighting switching activity (WSA) value for the circuit caused by the particular test pattern.

However, toggling based metrics, such as WSA values, have been found to have only a limited correlation with IR-drops; sometimes a circuit with a higher toggle value does not suffer from a high IR-drop, whilst a circuit with a lower toggle value might suffer a high from IR-drop. As a result, ATPG tools that rely on toggle metrics to identify test patterns that could cause large IR-drops tend to be over constrained, causing the need for more test patterns (and thus more test time), while providing less coverage.

Reliable IR-drop-aware test pattern generation is required to avoid yield loss, increase test coverage and decrease test time. Test time has serious impact on the product cost (scan tests cost is 20% to 50% of the total test cost, while the test cost is 50% of the product cost). Setting appropriate constraints on the ATPG tool may save 10%-30% (or more) of the total patterns' duration. So the potential for saving is 3%-5% of the product cost.

SUMMARY OF THE INVENTION

The present invention provides a method of validating a test pattern for at-speed testing of at least one integrated circuit (IC) design, a method of automated test pattern generation for generating test patterns used during at-speed testing and an automated test pattern generation apparatus as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
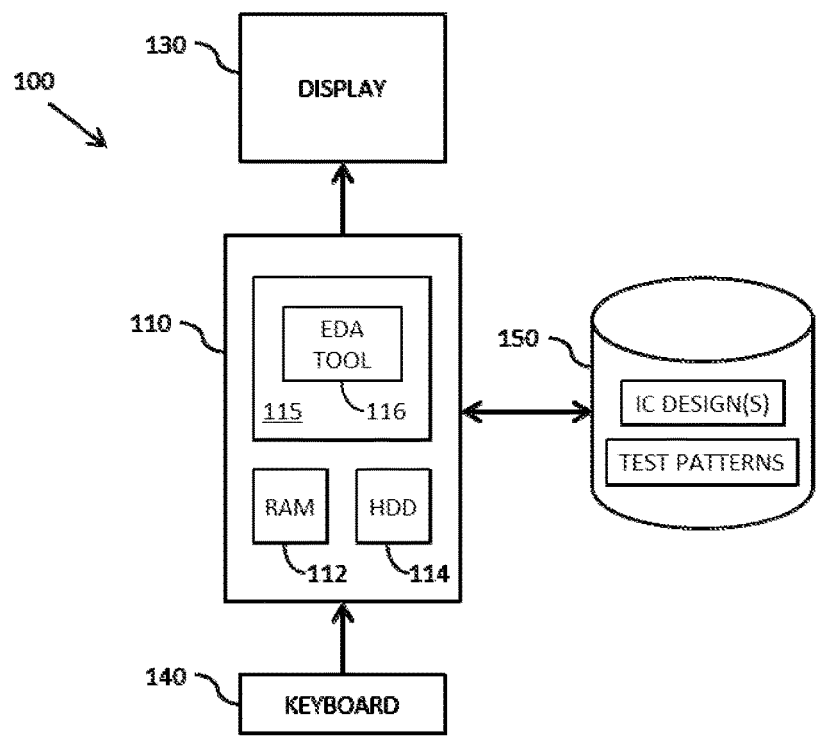
FIG. 1 illustrates a simplified block diagram of an example of an automated test pattern generation (ATPG) apparatus.

The present invention will now be described with reference to the accompanying drawings in which an example of a method and apparatus for validating a test pattern for at-speed testing of integrated circuit (IC) designs are illustrated. However, it will be appreciated that the present invention is not limited to the specific examples herein described and illustrated in the accompanying drawings, and various modifications may be made without departing from the present invention.

Furthermore, because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

In accordance with some examples of a first aspect of the invention there is provided a method of validating a test pattern for at-speed testing of at least one integrated circuit (IC) design.

The following notation will be used to describe the innovation:

1. Rise activity—the output voltage of a single IC element (such as instance or a transistor) changing from low voltage (that may be defined as "0") to high voltage (that may be defined as "1").
2. Fall activity—the output voltage of a single IC element changing from high voltage to low voltage
3. Weighted rise/fall activity—a function that transfers a combination of rise/fall events and user defined characteristic to a value. An example for such a function may be summing the amount of rise/fall events for a specific group of instances, where each rise/fall event on an IC element is multiplied by the capacity on nets connected to the IC element.

The method comprises calculating at least one weighted rise activity, WRA, value for at least one region of the IC design based at least partly on rising gate transitions within the at least one region of the IC design when the test pattern is applied thereto, calculating at least one weighted fall activity, WFA, value for the at least one region of the IC design based at least partly on fall gate transitions within the at least one region of the IC design when the test pattern is applied thereto, and validating the test pattern based at least partly on the WRA value and the WFA value.

In this manner, a test pattern may be validated based on separate weighted rising and falling values for a region of an IC design when the test pattern is applied thereto, thereby enabling the often asymmetric characteristics of the power distribution network for the region of the IC design may be taken into consideration when validating the test pattern.

In one optional embodiment, the method may comprise determining a WRA threshold value for the at least one region of the IC design, determining a WFA threshold value for the at least one region of the IC design, and validating the test pattern based at least partly on a comparison of the calculated WRA value with the WRA threshold value and a comparison of the calculated WFA value with the WFA threshold value for the at least one region.

In one optional embodiment, the method may comprise dividing the IC design into a plurality of regions and for each region: calculating at least one WRA value; calculating at least one WFA value; and validating the test pattern for the respective region based at least partly on the WRA value and the WFA value.

In one optional embodiment, the WRA threshold value for the at least one region of the IC design may be determined based at least partly on at least one parameter from a group comprising:
  a charge supply capacity of a high voltage power distribution network for the at least one region of the IC design;
  a functional component of the IC design to which the at least one region of the IC design relates;
  a type of IC package; and
  a process corner.

In one optional embodiment, the WFA threshold value for the at least one region of the IC design may be determined based at least partly on at least one parameter from a group comprising:
  a charge sink capacity of a low voltage power distribution network for the at least one region of the IC design;
  a functional component of the IC design to which the at least one region of the IC design relates;
  a type of IC package; and
  a process corner.

In one optional embodiment, the method may comprise dividing the IC design into a plurality of regions comprising at least one of:
  power domain regions;
  functional regions; and
  grid based regions.

In one optional embodiment, calculating a WRA value for the at least one region of the IC design may comprise identifying all gates in the at least one region that are caused to transition from a low logical state to a high logical state when the test pattern is applied thereto and calculating the WRA value for the at least one region of the IC design based at least partly on the identification of gates in the at least one region that are caused to transition from a low logical state to a high logical state when the test pattern is applied thereto.

In one optional embodiment, calculating a WRA value for the at least one region of the IC design may comprises identifying all gates in the at least one region that are caused to transition from a low logical state to a high logical state when the test pattern is applied thereto, determining a weighted value for each identified gate based on a fan-out count for the respective gate, and summing the weighted gate values of the identified gates to obtain the WRA value for the at least one region of the IC design.

In one optional embodiment, calculating a WFA value for the at least one region of the IC design may comprise identifying all gates in the at least one region that are caused to transition from a high logical state to a low logical state when the test pattern is applied thereto and calculating the WFA value for the at least one region of the IC design based at least partly on the identification of gates in the at least one region that are caused to transition from a high logical state to a low logical state when the test pattern is applied thereto.

In one optional embodiment, calculating a WFA value for the at least one region of the IC design may comprises identifying all gates in the at least one region that are caused to transition from a high logical state to a low logical state when the test pattern is applied thereto, determining a weighted value for each identified gate based on a fan-out count for the respective gate, and summing the weighted gate values of the identified gates to obtain the WFA value for the at least one region of the IC design.

In accordance with some examples of a second aspect of the invention there is provided a method of automated test pattern generation for generating test patterns used during at-speed testing. The method comprises generating a set of test patterns comprising at least one test pattern for at-speed testing of at least one integrated circuit (IC) design, validating the at least one at-speed test pattern of the set of test patterns using the method of the first aspect of the invention, and outputting a subset of validated test patterns.

In accordance with some examples of a third aspect of the invention there is provided an automated test pattern generation apparatus comprising at least one processing module arranged to perform a method of either of the first and/or second aspect of the invention.

Referring now to FIG. 1, there is illustrated a simplified block diagram of an example of an Electronic design automation (EDA) apparatus 100. The EDA apparatus 100 illustrated in FIG. 1 comprises a computing device 110, the computing device 110 comprising one or more processing modules 115. The computing device 110 further comprises one or more memory modules. For example, the computing device 110 may comprise one or more volatile memory elements such Random Access Memory (RAM) 112. The computing device 110 may additionally/alternatively comprise one or more non-volatile memory elements such as one or more hard disk drives 114. In the illustrated example, the computing device 110 is operably coupled to a user input device comprising keyboard 140 and an output device comprising display 130. The computing device 110 may further be operably coupled to one or more data storage devices 150 in which IC design data, test pattern data, etc. may be stored.

The processing module(s) 115 is/are arranged to execute EDA software such as, but not limited to, an ATPG software tool 116. For example, computer program code for the ATPG software tool 116 may reside within, in the illustrated example, the non-volatile memory 114 of the computing device 110. When the ATPG software tool 116 is to be executed, the computer program code for the ATPG software tool 116 may be loaded into RAM memory 112 from where the ATPG software tool 116 may be executed by the processing module(s) 115. One task that may be performed by the ATPG software tool 116 is to identify test patterns that could cause large IR-drops during, for example at-speed testing.

Figure 2:
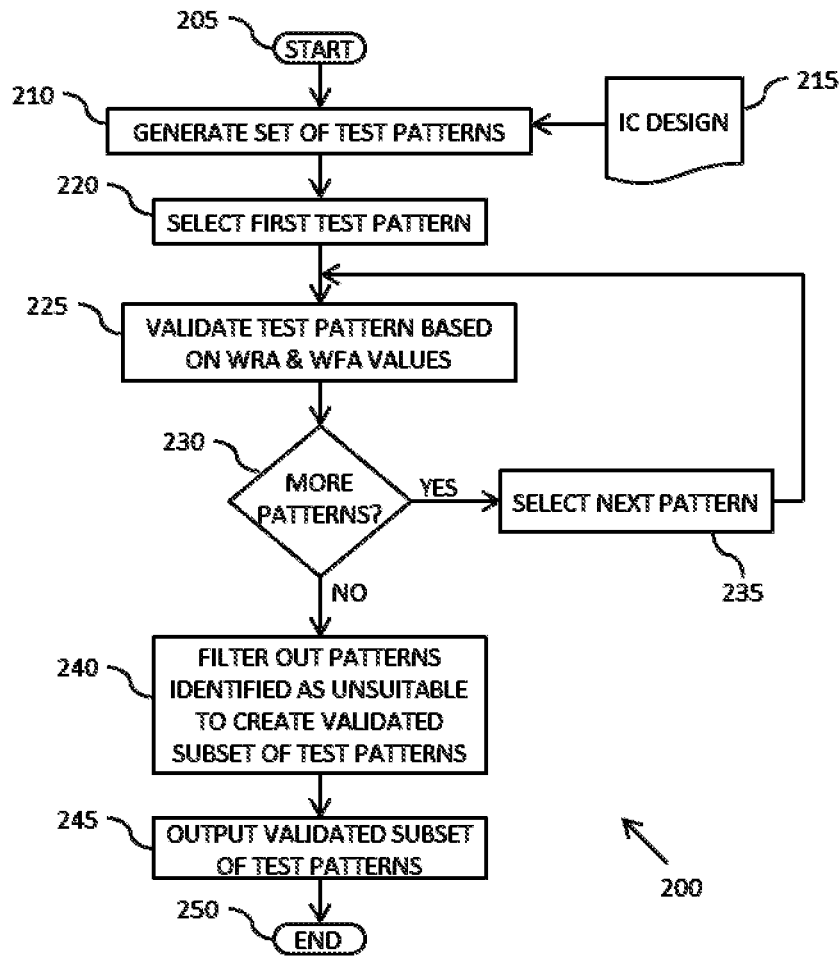
FIG. 2 illustrates a simplified flowchart of an example of a method of automated test pattern generation.

Referring now to FIG. 2, there is illustrated a simplified flowchart 200 of an example of a method of automated test pattern generation, and in particular an example of a method of automated test pattern generation for generating test patterns used during at-speed testing, such as may be implemented within the ATPG software tool 116 executed by the EDA apparatus 100 of FIG. 1. The method starts at 205, for example upon a user of the EDA apparatus 100 initiating test pattern generation by the ATPG software tool 116, and moves on to 210 where a set of test patterns are generated for an IC design 215. For example, the ATPG software tool 116 may be arranged to retrieve IC design information from the data storage device(s) 150, such IC design information being in the form of, say, one or more gate-level netlists or the like for the IC design. Having generated the set of test patterns, the method moves on to 220 where a first test pattern is selected. The selected test pattern is then validated at 225, for example as described in greater detail below with reference to FIG. 3. Specifically, selected test patterns are validated based on Weighted Rise Activity (WRA) values and Weighted Fall Activity (WFA) values for the IC design when the test patterns are applied thereto. This is in contrast to conventional techniques that rely on Weighted Switching Activity (WSA) values that have been found to have only a limited correlation with IR-drops.

Once validation of the selected test pattern has been validated, it is determined whether any more of the test patterns within the generated set of test patterns require validating, at 230. If it is determined that one or more test patterns still require validating, a next test pattern to be validated is selected at 235 and the method loops back to 225 where the selected test pattern is validated.

Once it is determined that all test patterns have been validated at 230, the method moves on to 240 where in the illustrated example those test patterns identified as being unsuitable during the validation thereof at 225 are filtered out to create a subset of test patterns comprising the remaining test patterns that were not identified as being unsuitable. This subset of test patterns is then output, at 245. For example, the ATPG software tool 116 of FIG. 1 may output the subset of (validated) test patterns to the data storage device(s) 150 for subsequent use during testing of IC devices corresponding to the IC design 215. The method then ends, at 250.

Figure 4:
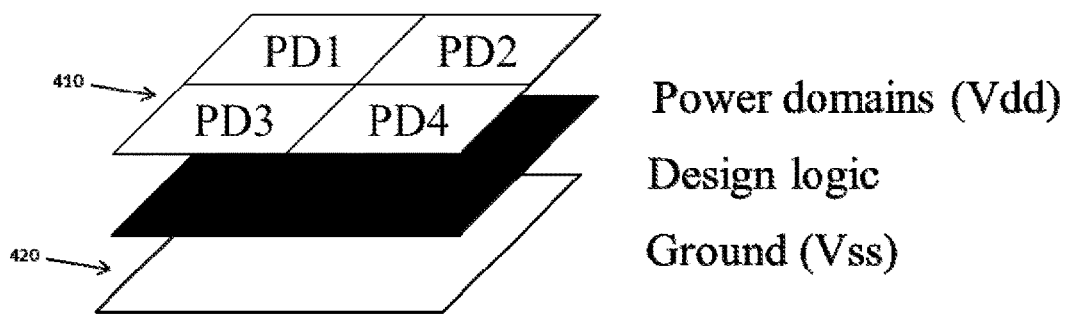
FIG. 4 illustrates a simplified view of a power distribution network for an integrated circuit design.
Figure 3:
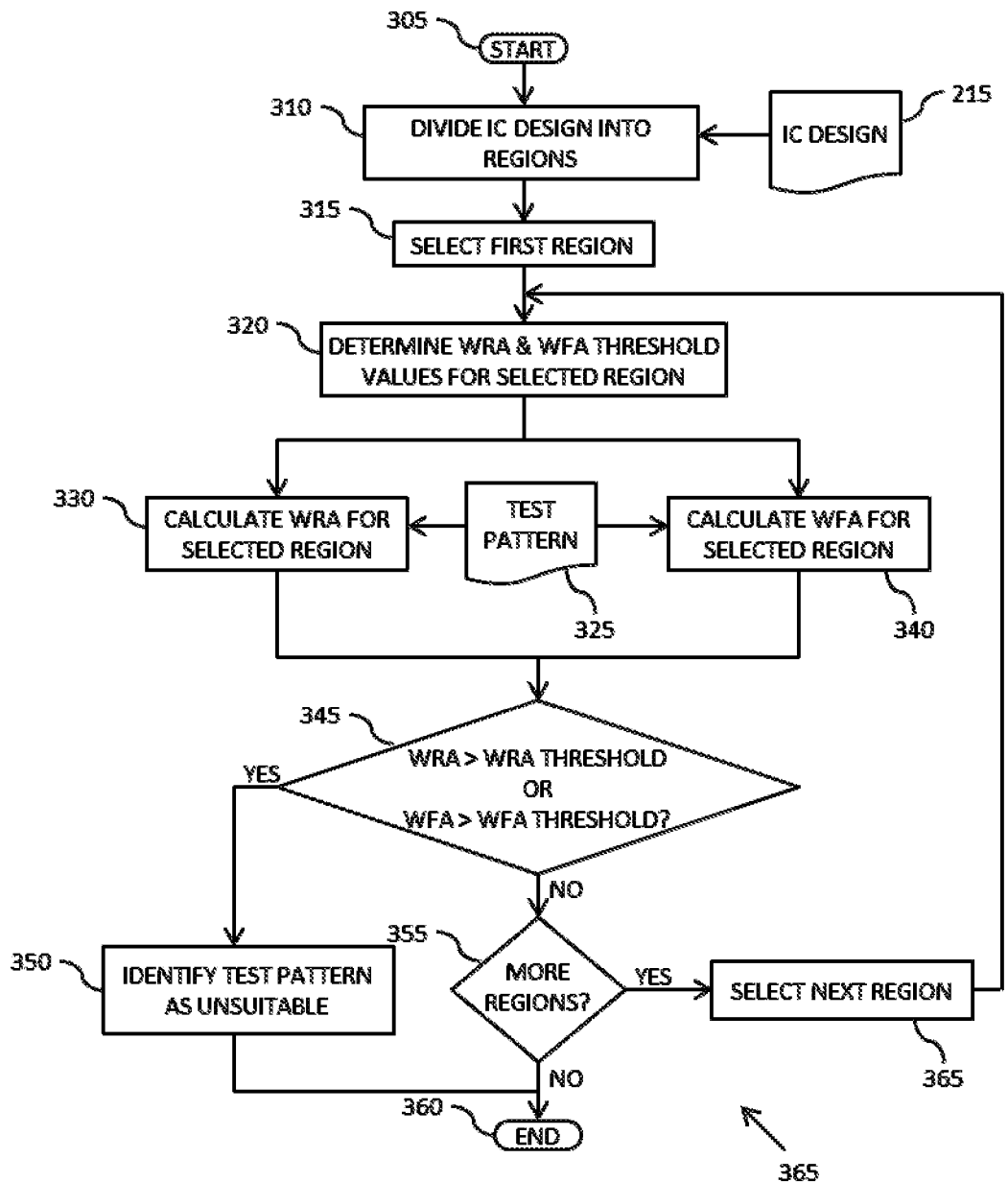
FIG. 3 illustrates a simplified flowchart of an example of a method of validating a test pattern.

Referring now to FIG. 3, there is illustrated a simplified flowchart 300 of an example of a method of validating a test pattern, such as may be performed as at least a part of the validation performed at 225 in the method of FIG. 2. In particular, FIG. 3 illustrated an example of a method of validating a test pattern for at-speed testing of an IC design. The method of FIG. 3 starts at 305 and moves on to 310 where in the illustrated example the IC design 215 is divided into regions. In this manner, the test pattern may be validated separately for each region of the IC design. For example, and as illustrated in FIG. 4, part of the power distribution network for an IC design may be divided into multiple power domains. In particular, it is known to divide the high voltage supply part of the power distribution network, indicated generally at 410 in FIG. 4, into multiple power domains. As such, at 310 in the method of FIG. 3 the IC design may be divided into regions corresponding to the different power domains of the power distribution network. In this manner, the effect of the test pattern on each power domain may be validated separately to more accurately identify test patterns that could cause large IR-drops on a particular power domain. Additionally/alternatively, it is contemplated that the IC design may be divided into regions based on other criteria such as, for example, corresponding to functional blocks within the IC design, and/or on a grid based area division. It is contemplated that in some examples, for example where test patterns are being validated for a simple IC design comprising a single power domain, the IC design may be 'divided' into just a single region.

Referring back to FIG. 3, having divided the IC design into regions at 310, the method moves on to 315 where a first region is selected. WRA and WFA threshold values are then determined for the selected region, at 320. As previously mentioned, it is known to divide the high voltage supply part of the power distribution network, indicated generally at 410 in FIG. 4, into multiple power domains. However, the low voltage supply (e.g. ground) part of a power distribution network, indicated generally at 420 in FIG. 4, is typically not divided up into multiple power domains in the same manner as the high voltage supply part of the power distribution network. This can result in different characteristics for the high and low voltage supply parts 410, 420 of the power distribution network, for example with the low voltage supply (e.g. ground) part 420 of the power distribution network having a greater charge capacity than the various power domains of the high voltage supply part 410 of the power distribution network. As a result, the low voltage supply (e.g. ground) part 420 of the power distribution network is often able to tolerate higher switching activity than the power domains of the high voltage supply part 410 of the power distribution network.

Thus, the inventors have recognised that different falling gate transition activities (which are driven by the low voltage supply part 420 of the power distribution network) and rising gate transition activities (which are driven by the high voltage supply part 410 of the power distribution network) may be tolerated by a functionally correct device of the IC design. Accordingly, in some examples different WRA and WFA threshold values may be determined, and in particular it is contemplated that a WFA threshold value may be determined that is higher than the WRA threshold value. In this manner, the WRA and WFA threshold values may be determined based at least partly on a charge supply/sink capacity of the respective parts of the power distribution network for the selected region. The WRA and WFA threshold values may further be determined based on, say, a functional block/component of the selected region, a specified type of IC package to be used, a specified process corner, etc.

Having determined the WRA and WFA threshold values for the selected domain, the method moves on to 330 and 340 where WRA and WFA values are calculated respectively for the selected region when the test pattern 325 is applied thereto.

Calculating a WRA value at 330 for the selected region may comprise identifying those gates in the selected region of the IC design that are caused to transition from a low logical state to a high logical state when the test pattern 325 is applied thereto, and calculating the WRA value for the selected region of the IC design based at least partly on said identified gates. For example, calculating the WRA value may comprise identifying the gates in the at least one region that are caused to transition from a low logical state to a high logical state when the test pattern 325 is applied thereto, determining a weighted value for each identified gate based on, say, a fan-out count for the respective gate, and summing the weighted gate values of the identified gates to obtain the WRA value for the at least one region of the IC design.

Calculating a WFA value at 340 for the selected region may comprise identifying those gates in the selected region of the IC design that are caused to transition from a high logical state to a low logical state when the test pattern 325 is applied thereto, and calculating the WFA value for the selected region of the IC design based at least partly on said identified gates. For example, calculating the WFA value may comprise identifying the gates in the at least one region that are caused to transition from a high logical state to a low logical state when the test pattern 325 is applied thereto, determining a weighted value for each identified gate based on, say, a fan-out count for the respective gate, and summing the weighted gate values of the identified gates to obtain the WFA value for the at least one region of the IC design.

The calculated WRA and WFA values are then compared to their respective threshold values (determined at 320) at 345. In the illustrated example, if at least one of the calculated WRA and WFA values exceeds the respective threshold value, it is determined that the test pattern 325 is likely to cause excessive rising or falling activity within the selected region of the IC design, and thus is likely to cause an excessive IR-drop during at-speed testing. Accordingly, the test pattern is identified as unsuitable at 350, and the method ends at 360. However, if both the calculated WRA and WFA values are less than their respective threshold values, at 345, it may be determined that the test pattern 325 is not likely to cause excessive switching (rising or falling) activity within the selected region of the IC design. Accordingly, the method moves on to 355 where it is determined whether there are any more regions of the IC design for which the test pattern 325 is required to be validated. If it is determined that there are one or more regions of the IC design for which the test pattern 325 is required to be validated, a next region is selected at 365, and the method loops back to 320. Conversely, if it is determined that there are no more regions of the IC design for which the test pattern 325 is required to be validated, at 355, the method ends at 360.

Thus a method and apparatus have been described in which a test pattern may be validated based on separate weighted rising and falling values for a region of an IC design when the test pattern is applied thereto. In this manner, the often asymmetric characteristics of the power distribution network for the region of the IC design may be taken into consideration when validating the test pattern, enabling a more reliable validation of the test pattern with regard to determining whether the test pattern is likely to cause excessive rising or falling activity within the selected region of the IC design during at-speed testing, and thus is likely to cause an excessive IR-drop during at-speed testing that could cause functionally correct devices to fail the at-speed testing. Significantly, a less constrained, faster, more reliable validation of test patterns may be implemented, enabling the number of test patterns that are (incorrectly) filtered out to be reduced whilst also enabling the number of problematic test patterns that (incorrectly) pass the validation process to also be reduced. As a result, because the validation of test patterns is able to be less constrained, test patterns comprising greater test coverage are able to be validated and used during testing, reducing the number of test cycles required and thus the amount of time required for testing devices, without leading to unnecessarily high yield loss.

In the illustrated example, an ATPG software tool 116 has been illustrated and described as validating test patterns as part of a method of automated test pattern generation. However, it is contemplated that in some examples the ATPG software tool 116 may equally be arranged to validate test patterns (such as illustrated in FIG. 3) independently of a method of automated test pattern generation. For example, the ATPG software tool 116 may be arranged to retrieve one or more previously generated test pattern(s) from, say, the data storage device(s) 150 and perform a method of validating the test pattern(s), such as the method illustrated in FIG. 3.

Furthermore, in the example illustrated in FIG. 3 the test pattern is validated for each region sequentially, on a per region basis; one region after the other. However, it is contemplated that in some alternative examples the test pattern may equally be validated on multiple regions substantially simultaneously (i.e. in parallel).

The invention may be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A method performed by an electronic design automation apparatus of validating a test pattern for at-speed testing of at least one integrated circuit, IC, design, the method comprising:
    calculating by the electronic design automation apparatus, at least one weighted rise activity, WRA, value for at least one region of the IC design based at least partly on rising gate transitions within the at least one region of the IC design when the test pattern is applied thereto;
    calculating by the electronic design automation apparatus, at least one weighted fall activity, WFA, value for the at least one region of the IC design based at least partly on fall gate transitions within the at least one region of the IC design when the test pattern is applied thereto; and
    validating by the electronic design automation apparatus, the test pattern based at least partly on the WRA value and the WFA value, wherein the validating the test pattern is based at least partly on a comparison of the calculated WRA value with a WRA threshold value and a comparison of the calculated WFA value with a WFA threshold value for the at least one region.

2. The method of claim 1, wherein the method comprises:
    determining the WRA threshold value for the at least one region of the IC design;
    determining the WFA threshold value for the at least one region of the IC design; and.

3. The method of claim 1, wherein the method comprises dividing the IC design into a plurality of regions and for each region:
    calculating at least one WRA value;
    calculating at least one WFA value; and
    validating the test pattern for the respective region based at least partly on the WRA value and the WFA value.

4. The method of claim 2, wherein the WRA threshold value for the at least one region of the IC design is determined based at least partly on at least one parameter from a group comprising:
    a charge supply capacity of a high voltage power distribution network for the at least one region of the IC design;
    a functional component of the IC design to which the at least one region of the IC design relates;
    a type of IC package; and
    a process corner.

5. The method of claim 2, wherein the WFA threshold value for the at least one region of the IC design is determined based at least partly on at least one parameter from a group comprising:
    a charge sink capacity of a low voltage power distribution network for the at least one region of the IC design;
    a functional component of the IC design to which the at least one region of the IC design relates;
    a type of IC package; and
    a process corner.

6. The method of claim 1, wherein the method comprises dividing the IC design into a plurality of regions comprising at least one of:
    power domain regions;
    functional regions; and
    grid based regions.

7. The method of claim 1, wherein calculating a WRA value for the at least one region of the IC design comprises identifying all gates in the at least one region that are caused to transition from a low logical state to a high logical state when the test pattern is applied thereto and calculating the WRA value for the at least one region of the IC design based at least partly on the identification of gates in the at least one region that are caused to transition from a low logical state to a high logical state when the test pattern is applied thereto.

8. The method of claim 6, wherein calculating a WRA value for the at least one region of the IC design comprises:

identifying all gates in the at least one region that are caused to transition from a low logical state to a high logical state when the test pattern is applied thereto;

determining a weighted value for each identified gate based on a fan-out count for the respective gate; and summing the weighted gate values of the identified gates to obtain the WRA value for the at least one region of the IC design.

9. The method of claim 1, wherein calculating a WFA value for the at least one region of the IC design comprises identifying all gates in the at least one region that are caused to transition from a high logical state to a low logical state when the test pattern is applied thereto and calculating the WFA value for the at least one region of the IC design based at least partly on the identification of gates in the at least one region that are caused to transition from a high logical state to a low logical state when the test pattern is applied thereto.

10. The method of claim 8, wherein calculating a WFA value for the at least one region of the IC design comprises:

identifying all gates in the at least one region that are caused to transition from a high logical state to a low logical state when the test pattern is applied thereto;

determining a weighted value for each identified gate based on a fan-out count for the respective gate; and summing the weighted gate values of the identified gates to obtain the WFA value for the at least one region of the IC design.

11. A method performed by an electronic design automation apparatus of automated test pattern generation for generating test patterns used during at-speed testing, the method comprising:

generating a set of test patterns comprising at least one test pattern for at-speed testing of at least one integrated circuit, IC, design;

validating the at least one at-speed test pattern of the set of test patterns using the method of claim 1; and outputting a subset of validated test patterns.

12. The method of claim 2, wherein the method comprises dividing the IC design into a plurality of regions and for each region:

calculating at least one WRA value;

calculating at least one WFA value; and validating the test pattern for the respective region based at least partly on the WRA value and the WFA value.

13. The method of claim 3, wherein the WRA threshold value for the at least one region of the IC design is determined based at least partly on at least one parameter from a group comprising:

a charge supply capacity of a high voltage power distribution network for the at least one region of the IC design;

a functional component of the IC design to which the at least one region of the IC design relates;

a type of IC package; and a process corner.

14. The method of claim 3, wherein the WFA threshold value for the at least one region of the IC design is determined based at least partly on at least one parameter from a group comprising:

a charge sink capacity of a low voltage power distribution network for the at least one region of the IC design;

a functional component of the IC design to which the at least one region of the IC design relates;

a type of IC package; and a process corner.

15. The method of claim 4, wherein the WFA threshold value for the at least one region of the IC design is determined based at least partly on at least one parameter from a group comprising:

a charge sink capacity of a low voltage power distribution network for the at least one region of the IC design;

a functional component of the IC design to which the at least one region of the IC design relates;

a type of IC package; and a process corner.

16. The method of claim 2, wherein calculating a WRA value for the at least one region of the IC design comprises identifying all gates in the at least one region that are caused to transition from a low logical state to a high logical state when the test pattern is applied thereto and calculating the WRA value for the at least one region of the IC design based at least partly on the identification of gates in the at least one region that are caused to transition from a low logical state to a high logical state when the test pattern is applied thereto.

17. The method of claim 3, wherein calculating a WRA value for the at least one region of the IC design comprises identifying all gates in the at least one region that are caused to transition from a low logical state to a high logical state when the test pattern is applied thereto and calculating the WRA value for the at least one region of the IC design based at least partly on the identification of gates in the at least one region that are caused to transition from a low logical state to a high logical state when the test pattern is applied thereto.

18. The method of claim 4, wherein calculating a WRA value for the at least one region of the IC design comprises identifying all gates in the at least one region that are caused to transition from a low logical state to a high logical state when the test pattern is applied thereto and calculating the WRA value for the at least one region of the IC design based at least partly on the identification of gates in the at least one region that are caused to transition from a low logical state to a high logical state when the test pattern is applied thereto.

19. The method of claim 5, wherein calculating a WRA value for the at least one region of the IC design comprises identifying all gates in the at least one region that are caused to transition from a low logical state to a high logical state when the test pattern is applied thereto and calculating the WRA value for the at least one region of the IC design based at least partly on the identification of gates in the at least one region that are caused to transition from a low logical state to a high logical state when the test pattern is applied thereto.

* * * * *